(12) United States Patent
Tao

(10) Patent No.: US 8,270,241 B2
(45) Date of Patent: Sep. 18, 2012

(54) Y-DECODE CONTROLLED DUAL RAIL MEMORY

(75) Inventor: Derek Tao, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 295 days.

(21) Appl. No.: 12/706,208

(22) Filed: Feb. 16, 2010

(65) Prior Publication Data

US 2011/0199846 A1 Aug. 18, 2011

(51) Int. Cl.
*G11C 7/12* (2006.01)
(52) U.S. Cl. .................... 365/203; 365/189.05
(58) Field of Classification Search .............. 365/203, 365/189.05
See application file for complete search history.

(56) References Cited

U.S. PATENT DOCUMENTS

| | | | |
|---|---|---|---|
| 7,408,818 B2 * | 8/2008 | Yoshinaga et al. | 365/189.09 |
| 2002/0196649 A1 * | 12/2002 | Song et al. | 365/63 |
| 2003/0076701 A1 * | 4/2003 | Fetzer | 365/51 |
| 2005/0174844 A1 * | 8/2005 | So et al. | 365/185.03 |

* cited by examiner

*Primary Examiner* — Michael Tran
(74) *Attorney, Agent, or Firm* — Lowe Hauptman Ham & Berner, LLP

(57) ABSTRACT

An embodiment of the invention is related to a memory that includes a memory array having a plurality of memory banks, each of which includes a plurality of rows and a plurality of columns of memory cells. Each memory column includes a switch circuit providing a first voltage and a second voltage to memory cells in the column and to the pre-charge circuit associated with the column. In an application, at one particular point in time (e.g., an accessed cycle), only one column in a memory bank uses the operating voltage Ovoltage while the other N−1 columns in the same memory bank use the retention voltage Rvoltage. Other embodiments are also disclosed.

20 Claims, 3 Drawing Sheets

Y-DECODE CONTROLLED DUAL RAIL MEMORY

TECHNICAL FIELD

The present disclosure is generally related to a memory. In various embodiments the memory array of the memory reduces leakage current in both operating and standby modes and as a result reduces total power consumption.

BACKGROUND

In the advance bulk CMOS technology (e.g., 40 nm and below), current leakage appears more and more significant. When the operating frequency is low (e.g., the corresponding device is running slow), the current leakage becomes dominant in total power consumption. To reduce total power consumption, one method reduces current leakage during standby mode, but fails to reduce leakage during normal operation. Conventional dual rail memory designs reduce the bit array leakage power during the memory standby or sleep mode, but, in various approaches, require an additional pin to select the power switches. These approaches also need long wake-up time before returning to the normal operating mode.

BRIEF DESCRIPTION OF THE DRAWINGS

The details of one or more embodiments are set forth in the accompanying drawings and the description below. Other features and advantages of the embodiments will be apparent from the description, drawings, and claims yes.

Like reference symbols in the various drawings indicate like elements.

DETAILED DESCRIPTION

Figure 1:
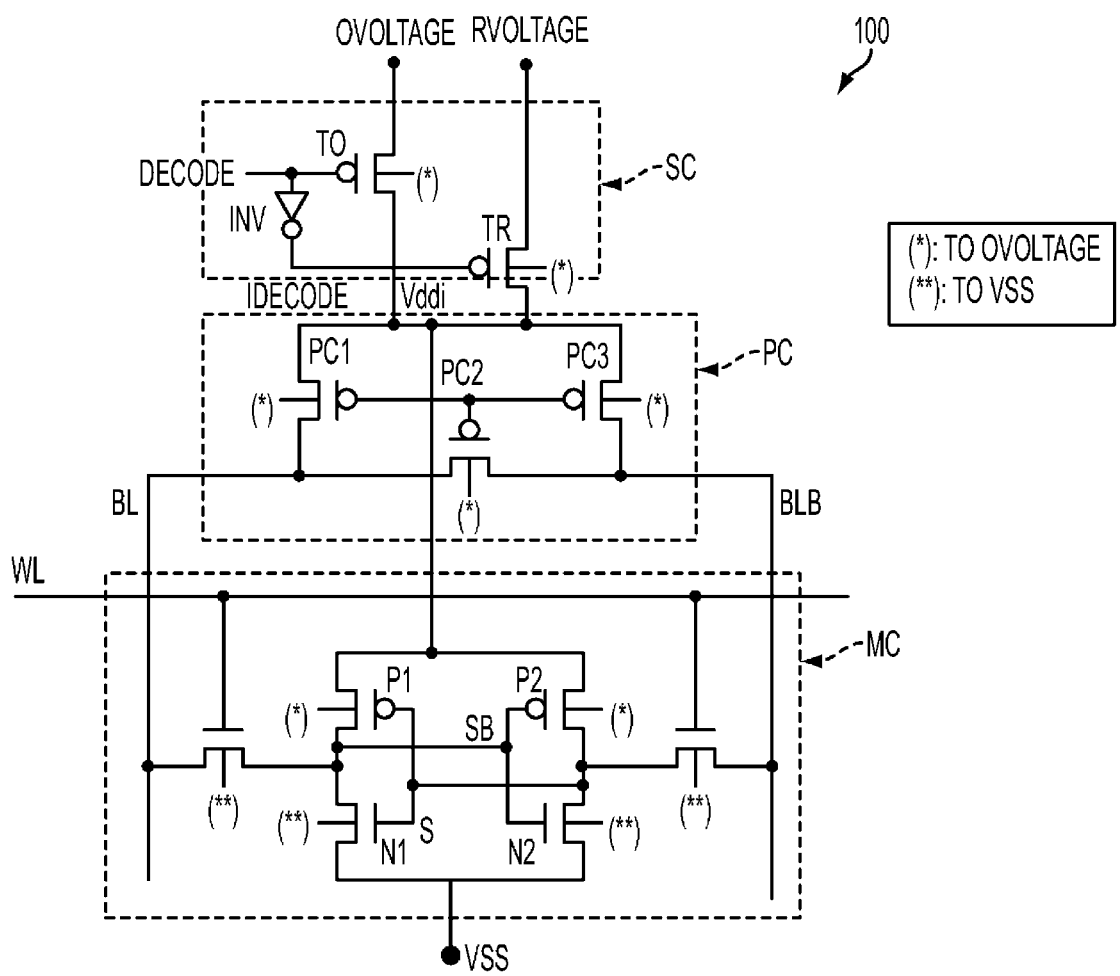
FIG. 1 shows a memory cell using dual voltages, in accordance with an embodiment.

Embodiments, or examples, of the disclosure illustrated in the drawings are now being described using specific language. It will nevertheless be understood that the embodiments and examples are not intended to be limiting. Any alterations and modifications in the disclosed embodiments, and any further applications of principles of the embodiments disclosed in this document are contemplated as would normally occur to one of ordinary skill in the pertinent art. Reference numbers may be repeated throughout the embodiments, but this does not necessarily require that feature(s) of one embodiment apply to another embodiment, even if they share the same reference number.

The Dual Voltage Memory Cell

FIG. 1 shows a circuit 100 illustrating operation of a dual-voltage memory cell (e.g., memory bit), in accordance with an embodiment. Voltage Ovoltage is configured as the normal operation voltage for memory cell MC and voltage Rvotlage is configured as the reduced or retention voltage for memory cell MC. Voltage Rvoltage is reduced compared to voltage Ovoltage, but remains at a level high enough to retain data in memory cell MC (e.g., to retain the data in nodes S and SB). In an embodiment, voltage Ovoltage is about 0.9 Volts (V) while voltage Rvoltage is about 0.5V. There are many ways to determine retention voltage Rvoltage commonly known in the art. A memory (e.g., memory 200 below) using memory cell MC may be referred to as a dual-rail memory because memory cell MC and thus memory 200 uses two supply voltages, e.g., operating voltage Ovoltage for normal operation and retention voltage Rvoltage for standby (e.g., reduced or retention) operation.

Switching circuit SC comprising transistors TO and TR when appropriate provides operating voltage Ovoltage or retention voltage Rvoltage to memory cell MC and to (pre)-charge circuit PC that comprises transistors PC1, PC2, and PC3. Signal Decode controls inverter INV to turn on/off transistor TO or transistor TR. For example, if signal Decode is high, it turns off transistor TR. At the same time, signal Idecode inverted by inverter INV from signal Decode is low, which turns on transistor TO. Similarly, when signal Decode is low, it turns on transistor TR. At the same time, signal Idecode inverted by inverter INV from signal Decode is high, and turns off transistor TO. The voltage level at node Vddi depends on whether transistor TO or transistor TR is on. If transistor TO is on, it passes the voltage level of operating voltage Ovoltage to node Vddi, and if transistor TR is on it passes the voltage level of retention voltage Rvoltage to node Vddi. For illustration purposes, memory cell MC is referred to as "active" when operating voltage Ovoltage is provided to memory cell MC and to charge circuit PC, and is referred to as "standby" when retention voltage Rvoltage is provided to memory cell MC and to charge circuit PC. In various embodiments, transistors TO and TR have high Vt (e.g., high threshold voltage) to reduce current leakage through these two transistors.

Voltage Vddi provides the supply voltage to pre-charge circuit PC. Data lines BL and BLB are (pre)-charged to operating voltage Ovoltage or retention voltage Rvoltage depending on the voltage level of voltage Vddi. For example, when appropriate, transistors PC1, PC2, and PC3 are activated, the voltage level of voltage Vddi is passed to data lines BL and BLB. If voltage Vddi is at operating voltage Ovoltage then this operating voltage Ovoltage is passed to lines BL and BLB, but if voltage Vddi is at retention voltage Rvoltage then this retention voltage Rvoltage is passed to lines BL and BLB. As a result, depending on situations, data lines BL and BLB are charged to operating voltage Ovoltage or to retention voltage Rvoltage.

Voltage Vddi also provides the supply voltage to memory cell MC. As a result, whether memory cell MC is at the operating mode (e.g., active) or at the standby mode (e.g., reduced voltage) also depends on the voltage level of voltage Vddi. As illustrated above, the voltage level of voltage Vddi depends on whether operating voltage Ovoltage or retention voltage Rvoltage is transferred to voltage Vddi. For example, upon memory cell MC being accessed, transistor TO transitions from off to on to provide operating voltage Ovoltage to voltage Vddi. As a result, voltage Vddi is switched (e.g., charged) from retention voltage Rvoltage to operating voltage Ovoltage from which memory cell MC operates. But if memory cell MC is not accessed, e.g., deactivated to the standby mode, transistor TR transitions from off to on to provide retention voltage Rvoltage to voltage Vddi from which memory cell MC operates. Alternatively expressing, voltage Vddi is discharged from operating voltage Ovoltage to retention voltage Rvoltage.

Transistors P1, P2, N1, and N2 form a cross latch, and together with nodes S and SB, store data for memory cell MC. Memory cell MC is commonly referred to as a bit cell.

Signal WL corresponds to a word line signal that selects a word of memory, commonly known in a memory including a memory array.

In various embodiments, to additionally reduce current leakage, substrates of P-type transistors in circuit 100 are coupled to operating voltage Ovoltage, and substrates of N-type transistors are coupled to voltage Vss, which depending on applications could be ground. Because operating voltage Ovoltage is generally higher than retention voltage Rvoltage, it is more difficult for current in transistors using retention voltage Rvoltage to leak to the substrate, which reduces current leakage and thus power consumption, and is therefore advantageous over other approaches in at least one embodiment.

Figure 2:
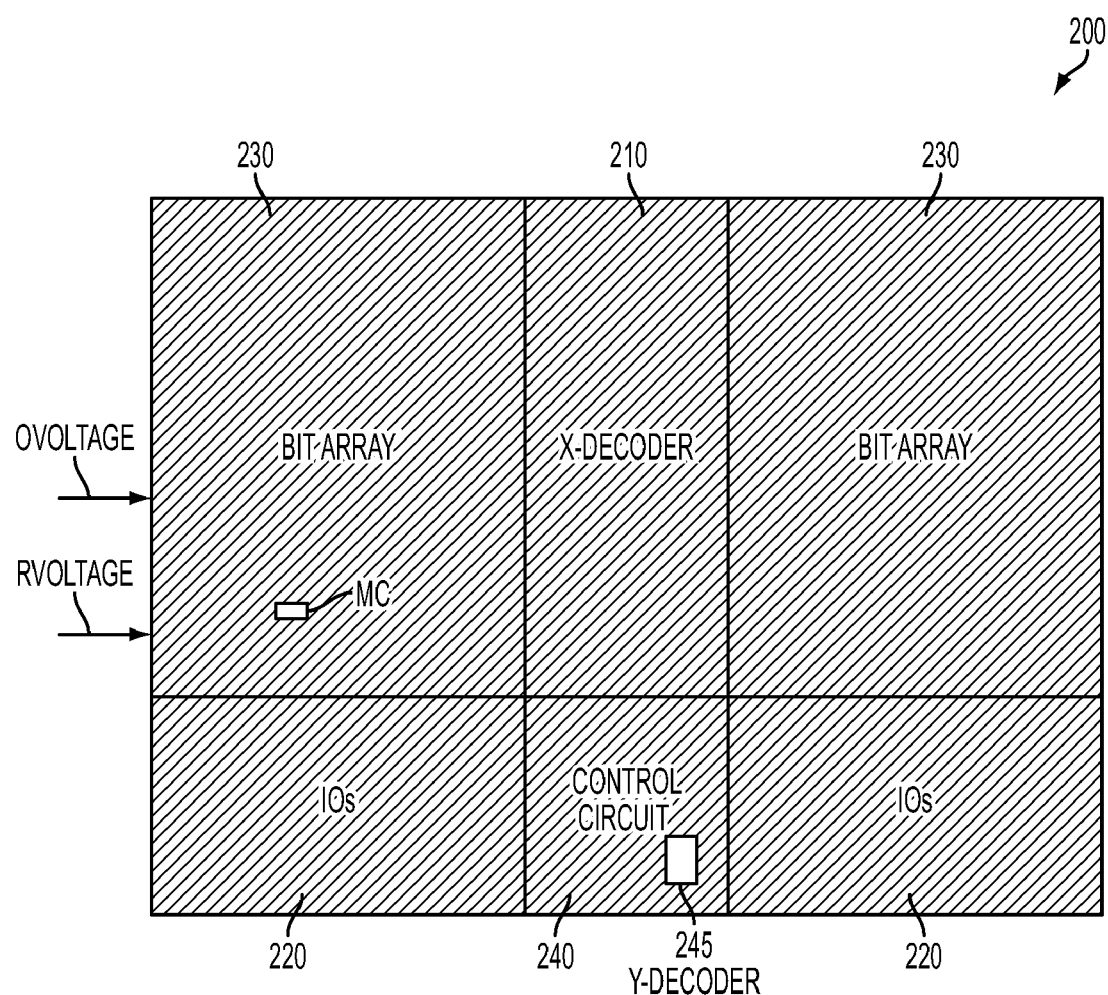
FIG. 2 shows a memory using the memory cell of FIG. 1, in accordance with an embodiment.
Figure 3:
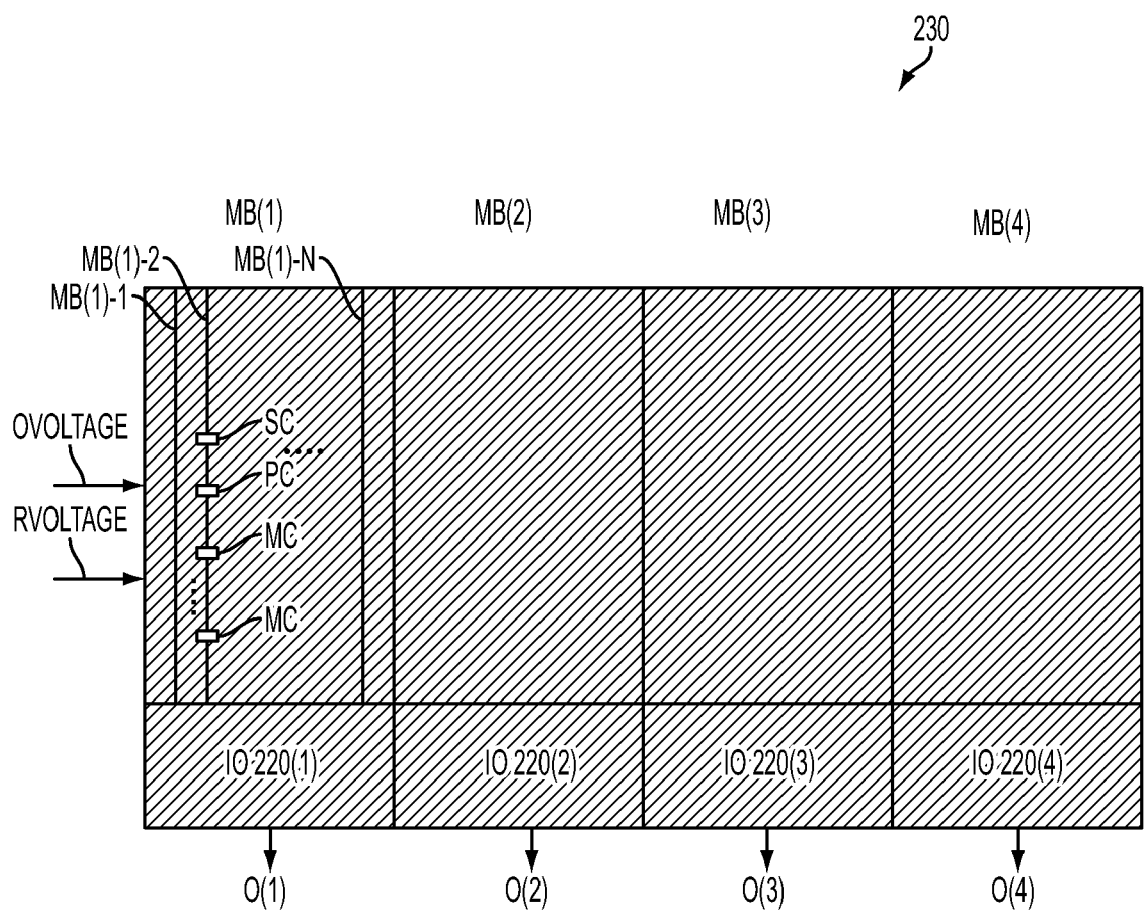
FIG. 3 shows a memory array of the memory in FIG. 2, in accordance with an embodiment.

In various embodiments, circuit 100 including additional memory cells MC sharing the same pair of data lines BL and BLB constitutes a column of memory cells (FIGS. 2 and 3 below).

The Memory

FIG. 2 shows a memory 200 using circuit 100, in accordance with an embodiment. Bit array 230 of memory 200 includes an array of memory cells MC arranged in rows and columns (FIG. 3, below). For illustration, only one memory cell MC is shown in FIG. 2.

X-decoder 210 provides the X- or row-address of a memory cell to be accessed (e.g., memory cell MC from which data is read or written to).

Control circuit 240 provides the pre-decode, clock, and other signals to memory 200. Control circuit 240 includes a Y- or column decoder 245 that provides the Y- or column address of memory cells MC. Y-decoder 245 shown in control circuit 240 is for illustration, but embodiments of the invention are not so limited. Y-decoder 245 may be outside of control circuit 240 and at any other convenient location.

IOs 220 serve as means for transferring data between the memory cells and other circuitry.

X-decoder 210, IOs 220, and control circuit 240 are commonly referred to as peripheral circuitry.

Memory 200 may be referred to as a dual rail memory because memory 200, like memory cell MC, uses two supply voltages, e.g., voltage OVoltage for normal operation and voltage Rvoltage for reduced or retention operation.

FIG. 2 shows memory 200 for illustration, but the embodiments of the invention are not so limited, and are applicable independent of the memory architecture. Various embodiments may be used in other memories having architectures different from that of memory 200.

The Memory Array

FIG. 3 shows memory array 230 and corresponding IOs 220 in accordance with an embodiment. Memory array 230 includes a plurality of memory banks MB, e.g., memory bank MB(1) to MB(L), but, for illustration, only four memory banks MB(1), MB(2), MB(3), and MB(4) are shown.

A memory bank MB includes a plurality of rows (e.g., M rows) and a plurality of columns (e.g., N columns) of memory cells MC. For example, memory bank MB(1) includes column MB(1)-1 to column MB(1)-N. Memory bank MB(2) includes column MB(2)-1 to column MB(2)-N. Memory bank MB(3) includes column MB(3)-1 to column MB(3)-N, etc., but, for simplicity, details of only memory bank MB(1) are shown. In various embodiments, memory cells MC in a column share the same pair of data lines BL and BLB (not shown in FIG. 3), the same pre-charge circuit PC, and the same node Vddi. Alternatively expressing, a column of memory cells corresponds to a switch circuit SC and thus a same voltage Vddi, a charge circuit PC, and a plurality of memory cells MC.

An IO 220 corresponds to a memory bank MB. For example, IOs 220(1) to 220(4) correspond to memory banks MB(1) to MB(4). An IO 220 controls the N columns in a memory bank MB including the particular column that includes the memory cell MC to be accessed. Generally, when memory 200 is accessed, a row of memory cells is accessed, and each accessed memory cell is from a memory bank MB. For illustration, the memory cells MC to be accessed are in columns MB(1)-2, MB(2)-2, MB(3)-2, and MB(4)-2. As such, a row of memory cells MC in the corresponding memory banks MB(1)-2, MB(2)-2, MB(3)-2, and MB(4)-2 are accessed, providing the data to outputs O(1), O(2), O(3), and O(4).

Depending on applications, a Y-decoder (e.g., Y-decoder 245) associated with a memory bank MB may include a multiplexer (e.g., a mux) to select the desired column, e.g., columns MB(1)-2, MB(2)-2, MB(3)-2, and MB(4)-2 as appropriate. Further, when a column (e.g., column MB(1)-2) is activated, Y-decoder 245 associated with that memory bank MB(1) provides the active signal Decode to turn on transistor TO in that column MB(1)-2, which provides voltage Ovoltage to all memory cells and to pre-charge circuit PC in that column MB(1)-2.

In various embodiments, in an access cycle to a memory bank MB, only one column (e.g., "active" column ACL), uses normal operating voltage OVoltage, while other N−1 columns (e.g., "inactive," "retention," or "standby") columns RCL), in the same memory bank MB use retention voltage Rvoltage. In the above example, in memory bank MB(1), column MB(1)-2 is the active column ACL, while columns MB(1)-1, and MB(1)-3 to MB(1)-N are retention columns RCL. In memory bank MB(2), column MB(2)-2 is the active column ACL, while columns MB(2)-1, and MB(2)-3 to MB(2)-N are retention columns RCL, in memory bank MB(3), column MB(3)-2 is the active column ACL, while columns MB(3)-1, and MB(3)-3 to MB(3)-N are retention columns RCL, and in memory banks MB(4), column MB(4)-2 is the active column ACL, while columns M(4)-1 and MB(4)-3 to MB(4)-N are retention columns. As a result, voltages Vddi in columns MB(1)-2, MB(2)-2, MB(3)-2, and MB(4)-2 are configured to be at voltage Ovoltage, and provide this voltage Ovoltage to all memory cells and to pre-charge circuits PC in columns MB(1)-2, MB(2)-2, MB(3)-2, and MB(4)-2. At the same time, voltages Vddi in other columns, e.g., columns MB(1)-1 and MB(1)-3 to MB(3)-N, MB(2)-1 and MB(2)-3 to MB(2)-N, MB(3)-1 and MB(3)-3 to MB(3)-N, and MB(4)-1 and MB(4)-3 to MB(4)-N are at retention voltage Rvoltage, and provide this retention voltage Rvoltage to all memory cells and to pre-charge circuits PC in columns MB(1)-1 and MB(1)-3 to MB(3)-N, MB(2)-1 and MB(2)-3 to MB(2)-N, MB(3)-1 and MB(3)-3 to MB(3)-N, and MB(4)-1 and MB(4)-3 to MB(4)-N.

For illustration in this document, activating a column refers to charging a column (e.g., columns MB(1)-2, MB(2)-2, MB(3)-2, MB(4)-2) from retention voltage Rvoltage to operating voltage Ovoltage, and deactivating a column (e.g. columns MB(1)-1, MB(2)-1, MB(3)-1, MB(4)-1) refers to discharging a column from operating voltage Ovoltage to retention voltage Rvoltage. Further, charging and discharging can be used interchangeably depending on how the voltage changes.

Depending on applications and architecture designs, a column of memory cells may include a plurality of segments each of which includes one or a plurality of memory cells. From the memory array perspective, a segment includes one or a plurality of rows of memory cells. In such situations, when a segment in a column is accessed, some embodiments provide operating voltage Ovoltage to that active segment only while the rest of other segments in the same column remain at retention voltage Rvoltage. Consequently, if a segment includes one row of memory cells, a column segment includes one memory cell, and according to some embodiments, only that one memory cell being accessed is activated.

Advantageous Features of the Various Embodiments

The below illustration is based on a memory bank, e.g., memory bank MB(1), but the operation and/or advantages are similar in other memory banks, e.g., memory banks MB(2) to MB(M), and a column includes one segment, but the inventive concept is applicable to columns having more than one segments, and a segment may include one or more memory cells.

Because one or more disclosed embodiments reduce power by having retention columns RCL at retention voltage Rvoltage, the more retention columns RCL exist in a memory bank MB, the more power is saved in the memory bank MB. As a result, if N is large, e.g., the number of columns in a memory bank MB and thus the number of retention columns RCL is large, the more some embodiments save power.

One or more of the disclosed embodiments reduce the dynamic or operating power, e.g., the power to operate memory 200 (e.g., to read and/or write data). Accessing (e.g., reading or writing to) a memory cell MC in a memory bank MB requires decoding an X-address and a Y-address for that particular memory cell MC and activating a column associated with the memory cell MC (e.g., column MB(1)-2) from retention voltage Rvoltage to operating voltage Ovoltage. Further, if prior to accessing memory cell MC there was a previous access (e.g., an access to memory cell PMC), the column associated with this memory cell PMC, e.g., column MB(1)-1, would be at the level of voltage Ovoltage. In that situation, embodiments also deactivate column MB(1)-1 from operating voltage Ovoltage to retention voltage Rvoltage. Additionally, in various embodiments, decoding an X-address for a memory access is much slower than decoding a Y-address for the same memory access, e.g., decoding time for the X address is dominant. As a result, embodiments are configured such that the access time including times for other activities (e.g., activating column MB(1)-2, deactivating column MB(1)-1, etc.) is within the time to decode the X-address. That is, embodiments are configured such that the total time to decode the Y-address and to activate column MB(1)-2 from a retention voltage Rvoltage to the operating voltage Ovoltage and to deactivate column MB(1)-1 from the operating voltage Ovoltage to the retention voltage Rvoltage is less than the time to decode the X-address. Consequently, even though some embodiments save power, some embodiments do not affect access time (e.g., speed) of memory array 200, unlike other approaches when power consumption is reduced, speed is sacrificed. Depending on applications, a pair of bit lines (e.g., bit line BL and bit line BLB) in a column is generally charged to voltage Vdd before sensing/reading data, and, in a read cycle, the data in the memory cell to be read pulls one bit line toward a low while the other bit line stays at voltage Vdd.

Because embodiments activate/deactivate a column (e.g., activate column MB(1)-2) and deactivate column MB(1)-1)) while the X-address is being decoded, embodiments are considered as having no wake up time because by the time the X-address has been completely decoded, embodiments are ready to access the data. Alternatively expressing, the "wake-up" time of various embodiments are embedded in the Y-decoding mechanism. Some embodiments are therefore advantageous over other approaches that normally take a few (e.g., 4-5) clock cycles to wake up a memory cell before data may be accessed from that memory cell.

Because some embodiments use the Y-decoder to activate/deactivate the corresponding columns (e.g., columns MB(1)-2), some embodiments do not require an extra pin to control such activation/deactivation of those columns, which is advantageous over other approaches that normally requires a control signal via a hardware pin to activate/deactivate the columns. System designs using disclosed embodiments are beneficial (e.g., simplified) based on this less number of pin count.

In various embodiments, at a particular point in time for data accessing, only one column (e.g., active column MB(1)-2) in a memory bank is at operating voltage Ovoltage, some embodiments need to turn only one column, e.g., column MB(1)-2 from retention voltage Rvoltage to operating voltage Ovoltage. Consequently, embodiments do not consume a lot of power to turn on almost all columns in a memory to the operating voltage Ovoltage. Additionally, in some embodiments, activating the voltage of active column MB(1)-2 is from Rvoltage to Ovoltage, which is from about 0.5 V to 0.9 V.

Various embodiments reduce leakage currents because most columns (e.g., standby columns RCL MB(1)-1 and MB(1)-3 to MB(N)) in the disclosed embodiments are at retention voltage Rvoltage, which is much less than the operating voltage Ovoltage, any current leakage, if incurred, would be less than the leakage if those columns had been at operating voltage Ovoltage.

In various embodiments, the semiconductor substrate for various transistors of memory array 200 is configured at operating voltage Ovoltage, and, as a result, the leakage between the source and/or the drain to the substrate of those transistors is reduced because the bias is reversed (e.g., between 0.5 V to 0.9 V), making it harder for current to leak.

A number of embodiments have been disclosed. It will nevertheless be understood that various modifications may be made without departing from the spirit and scope of the disclosed embodiments. For example, the various transistors being shown as a particular type (e.g., NMOS and PMOS) are for illustration purposes, embodiments of the invention are not limited to a particular type, but the dopant type selected for a particular transistor is a design choice and is within the scope of embodiments of the invention. The logic level (e.g., low or high) of the various signals used in the above description is also for illustration purposes, embodiments of the invention are not limited to a particular level when a signal is activated and/or deactivated, but, rather, selecting such a level is a matter of design choice and is within the scope of embodiments of the invention.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A memory array comprising:
at least one memory bank; a memory bank of the at least one memory bank including a plurality of columns of memory cells; at least one memory cell in a column of memory cells having a first power node configured to selectively receive a first voltage or a second voltage and a second power node configured to be coupled to a third voltage, voltage levels of the first voltage, the second voltage, and the third voltage being different; and a column decoder configured to provide a control signal to select the first voltage for the first power node when the at least one memory cell in the column is accessed and to select the second voltage for the first power node when the at least one memory cell in the column is not accessed.

2. The memory array of claim 1 further comprising a precharge circuit configured to charge a pair of data lines for the at least one memory cell in the column to the first or the second voltage.

3. The memory array of claim 1 wherein the first voltage is configured to operate the at least one memory cell and the second voltage is configured to retain data in a memory cell not being accessed.

4. The memory array of claim 1 wherein the second voltage is lower than the first voltage.

5. The memory of claim 1 wherein substrates of transistors in the at least one memory cell are configured to be at the first voltage.

6. The memory array of claim 1 further comprising
an X-decoder circuit and
a Y-decoder circuit;
a time for the X-decoder circuit to decode an X-address of the at least one memory cell is longer than a time for the Y-decoder circuit to decode a Y-address of the at least one memory cell plus a time to activate the column and to deactivate another column.

7. The memory array of claim 1 wherein the first voltage is associated with a first transistor and the second voltage is associated with a second transistor; the first transistor operating in a first mode; the second transistor operating in a second mode different from the first mode.

8. The memory array of claim 1 wherein the second voltage is provided to memory cells in columns different from the column having the at least one memory cell being accessed.

9. The memory array of claim 1 wherein all memory cells in the column having the at least one memory cell being accessed are provided with the first voltage.

10. The memory array of claim 1, wherein memory cells in the plurality of columns of memory cells are grouped into one or more segments, memory cells in one of the one or more segments having the at least one memory cell being accessed are provided with the first voltage.

11. A memory array comprising:
a first voltage source having a first voltage;
a second voltage source having a second voltage less than the first voltage;
a memory cell in a first column of memory cells having a first power node configured to receive the first voltage and a second power node configured to be coupled to a third voltage, a voltage level of the third voltage being different from that of the first voltage and the second voltage;

memory cells in a second column of memory cells different from the first column of memory cells, the memory cells in the second column each having a third power node configured to receive the second voltage and a fourth power node configured to be coupled to the third voltage; and a column address decoder configured to select the first voltage for the memory cell in the first column of the memory cells.

12. The memory array of claim 11 further comprising:
a charging circuit associated with the first column configured to receive the first voltage and to charge a first pair of data lines associated with the first column;
a charging circuit associated with the second column configured to receive the second voltage and to charge a second pair of data lines associated with the second column.

13. The memory array of claim 11 wherein substrates of transistors in the first column and of transistors in the second column are configured to receive the first voltage.

14. The memory array of claim 11 wherein the memory cell in the first column is being accessed and all memory cells in the second column are not being accessed.

15. The memory array of claim 11 wherein additional memory cells in the first column each have a fifth power node configured to receive the first voltage.

16. The memory array of claim 11 further comprising
an X-decoder circuit and
a Y-decoder circuit;
a time for the X-decoder circuit to decode an X-address of a memory cell in the first column is longer than a time for the Y-decoder circuit to decode a Y-address of the memory cell plus a time to activate the first column and to deactivate the second column.

17. The memory array of claim 11 wherein the first voltage is used to operate the memory cells in the first column and the second voltage is used to retain data in the memory cells in the second column.

18. A memory array comprising:
a plurality of memory banks, a memory bank including a plurality of memory cell columns; a memory cell column being associated with
a plurality of memory cells;
a pair of data lines;
a charging circuit configured to charge the pair of data lines;
a circuit providing a voltage to the plurality of memory cells and to the charging circuit; a voltage level of the voltage being provided depending on an operation mode of a memory cell of the plurality of memory cells.

19. The memory array of claim 18 wherein substrates of transistors in memory cells in the plurality of memory banks are configured to a first voltage level sufficient to operate the memory cells.

20. The memory array of claim 18 wherein the voltage level is at a first voltage sufficient to operate the memory cell if the memory cell is being accessed, and the voltage level is at a second voltage sufficient to retain data in the memory cell if the memory cell is not being accessed.

* * * * *